(12) United States Patent
Gupta

(10) Patent No.: US 11,929,746 B2
(45) Date of Patent: Mar. 12, 2024

(54) METHOD AND ARRANGEMENT FOR PROTECTING A DIGITAL CIRCUIT AGAINST TIME ERRORS

(71) Applicant: MINIMA PROCESSOR OY, Oulu (FI)

(72) Inventor: Navneet Gupta, Oulu (FI)

(73) Assignee: MINIMA PROCESSOR OY, Oulu (FI)

( * ) Notice: Subject to any disclaimer, the term of this patent is extended or adjusted under 35 U.S.C. 154(b) by 320 days.

(21) Appl. No.: 16/768,486

(22) PCT Filed: Dec. 1, 2017

(86) PCT No.: PCT/FI2017/050853
§ 371 (c)(1),
(2) Date: May 29, 2020

(87) PCT Pub. No.: WO2019/106226
PCT Pub. Date: Jun. 6, 2019

(65) Prior Publication Data
US 2020/0389156 A1    Dec. 10, 2020

(51) Int. Cl.
    *H03K 3/037*    (2006.01)
(52) U.S. Cl.
    CPC ......... *H03K 3/0372* (2013.01); *H03K 3/0375* (2013.01)
(58) Field of Classification Search
    CPC .. H03K 3/0372; H03K 3/0375; H03K 3/3562; H03K 3/35625
    See application file for complete search history.

(56) References Cited

U.S. PATENT DOCUMENTS

| 6,300,809 B1 * | 10/2001 | Gregor | ................... | H03K 3/037 327/200 |
| 8,301,970 B2 * | 10/2012 | Bowman | .............. | H03K 3/0375 714/744 |

(Continued)

OTHER PUBLICATIONS

Chen, M et al. *Flip-flop Hardening and Selection for Soft Error and Delay Fault Resilience*, In: 24th IEEE International Symposium on Defect and Fault Tolerance in VLSI Systems 2009, Oct. 2009, pp. 49-57.

(Continued)

*Primary Examiner* — Patrick O Neill
(74) *Attorney, Agent, or Firm* — Alston & Bird LLP

(57) ABSTRACT

Digital values obtained from an output of a preceding circuit element are temporarily stored and made available for a subsequent circuit element at a controlled moment of time. A digital value is received for temporary storage, as well as a triggering signal, a triggering edge of which defines an allowable time limit before which a digital value must appear at said data input to become available for said subsequent circuit element. A sequence of first and second pulse-enabled subregister stages is used to temporarily store said digital value. Said triggering signal is provided to said first pulse-enabled subregister stage delayed with respect to the triggering signal received by said second pulse-enabled subregister stage. The length of the delay is a fraction of a cycle of the triggering signal. A timing event observation signal is output as an indicator of said digital value at said data input having changed within a time window that begins at said allowable time limit and is shorter than one cycle of said triggering signal.

8 Claims, 8 Drawing Sheets

(56) References Cited

U.S. PATENT DOCUMENTS

| | | | | |
|---|---|---|---|---|
| 8,502,561 B2* | 8/2013 | Howard | ............... | H03K 5/1534 |
| | | | | 326/46 |
| 9,329,229 B2* | 5/2016 | Abadir | ............. | G01R 31/31725 |
| 2007/0168848 A1 | 7/2007 | Tschanz et al. | | |
| 2020/0389155 A1* | 12/2020 | Gupta | ................... | G06F 1/3206 |

OTHER PUBLICATIONS

International Search Report for PCT/FI2017/050852 dated Nov. 16, 2018 (3 pages).

Written Opinion for PCT/FI2017/050853 dated Nov. 16, 2018 (8 pages).

\* cited by examiner

METHOD AND ARRANGEMENT FOR PROTECTING A DIGITAL CIRCUIT AGAINST TIME ERRORS

CROSS-REFERENCE TO RELATED APPLICATIONS

This application is a national phase entry of International Application No. PCT/FI2017/050853, filed Dec. 1, 2017, the entire contents of which are incorporated herein by reference.

FIELD OF THE INVENTION

The invention relates to the basic elements or cells of which integrated circuits are built. In particular the invention relates to the prevention of processing errors that could otherwise be caused by delays in relation to a triggering signal, such as a clock signal.

BACKGROUND OF THE INVENTION

Processing of data in integrated circuits may take place in pipelines where the outputs of one or more previous combinational logic units are to constitute the inputs of one or more subsequent combinational logic units. The intermediate results are stored in registers between said combinational logic units. A clock signal synchronizes the propagation of digital values through the pipeline; in particular the storing of values into the registers. Some of the basic building blocks for use as said registers are latches and flip-flops.

An important difference between a latch and a flip-flop is that a latch is transparent during the whole pulse of a clock signal (or enabling signal, or any other pulsed control signal): its output may acquire the appropriate value even as a function of an input value that arrives late, i.e. even if the input value changes its state after the beginning of the current clock pulse. A flip-flop will lock its output as a function of the input value(s) at a triggering edge of the clock pulse, so any changes in input values after that can only affect the output at the next triggering edge of the clock pulse. Single edge triggered flip-flops can only change their state at one (rising or falling) edge of the clock pulse, while double edge triggered flip-flops may change their state at both rising and falling clock edges.

In an ideal circuit each circuit element makes its output settle early enough before the data is read into the subsequent circuit element on the appropriate clock pulse. In practical circuits this is not always the case. If a previous circuit element in the pipeline is late in making its output settle, the subsequent circuit element may operate incorrectly or in an unpredictable way. In the worst case a time error like this may seriously derail the whole execution of an algorithm, and even in controlled cases it may require rolling back the processing and flushing erroneous data from the pipeline, causing delay and unnecessary consumption of energy.

Integrated circuits that run on extremely low supply voltages are particularly prone to time errors, because the low supply voltage boosts the effect of e.g. random structural differences between transistors and other micro-scale components in the circuit that theoretically should be identical to each other but in practice are not. One solution would be to maintain the supply voltage high enough, with a suitable safety margin, but that would work against the aim of minimizing the energy consumption of the circuit.

Latches may be more tolerant against time errors than flip-flops, because a late arriving input bit to a latch just causes a corresponding delay before the output of the latch settles at the appropriate value (as long as the delay was shorter than the clock pulse enabling the latch). If a subsequent combinational logic is quick enough, it may even catch up the delay so that at the input of the next circuit element the processing is on time again. This is called time borrowing: the operation of the latch allows a preceding circuit element to "borrow" some processing time from a subsequent circuit element. Conventional flip-flops do not allow time borrowing because they lock their output at an edge of the clocking pulse. However, flip-flops have certain other advantages that would advocate preferring them in designing integrated circuits.

A solution known as the Razor is a kind of flip-flop capable of at least detecting time errors. FIG. 1 illustrates the Razor principle. Initially the multiplexer 101 connects its upper input to output, so input data D1 goes to the main flip-flop 102, which reads it in on the rising edge of the clock pulse CLK. If the input data had settled in time, the same input value went into the shadow latch 103, which is controlled by a delayed clock CLKD. Identical outputs of the main flip-flop 102 and the shadow latch 103 go to the XOR gate 104, the output of which (named ERROR) remains low. If, however, the value of D1 changes after it was read into the main flip-flop 102, the outputs of the main flip-flop 102 and the shadow latch 103 are different. The ERROR signal will go high, which in turn makes the multiplexer 101 change its active input, eventually restoring the correct value from the shadow latch 103 to the main flip-flop 102 at the next rising edge of the CLK signal. A known drawback of the Razor approach is that a timing violation of the main flip-flop 102 may cause metastability in the output Q1. The metastability can propagate to the subsequent circuit element in the pipeline. The error correction mechanism also introduces an obligatory delay of one whole clock cycle before the output of the main flip-flop 102 is restored to the correct value.

SUMMARY

An objective of the present invention is to provide a register circuit for temporarily storing a digital value in a pipeline using the flip-flop approach but simultaneously allowing time borrowing. Another objective of the invention is to provide such an approach that would be applicable to both single edge and double edge triggered flip-flops. A further objective of the invention is that a register circuit according to the invention can be built both from library cells and from custom cells. Yet another objective of the invention is that the register circuit is capable of announcing the occurrence of time borrowing to other parts of the integrated circuit.

The objectives of the invention are achieved by providing first and second pulse-enabled subregister stages that together constitute a register circuit of flip-flop type, and by deliberately delaying the triggering signal to the first pulse-enabled subregister stage with respect to the triggering signal going to the second pulse-enabled subregister stage.

A register circuit according to the invention is characterized by the features recited in the characterizing part of the appended independent claim directed to a register circuit.

An integrated circuit according to the invention is characterized in that it comprises at least one register circuit of the kind described above.

A method according to the invention is characterized by the features recited in the characterizing part of the appended independent claim directed to a method.

The invention covers also an embodiment in the form of a set of library instructions for designing a part of an integrated circuit, said set of library instructions being stored on a machine-readable tangible medium. They comprise one or more set of one or more machine-readable instructions that, when executed by a computer adapted for designing integrated circuits, are configured to effect the designing of a register circuit of the kind described above.

Further embodiments and advantages of the invention are described in the depending claims.

The verb "to comprise" is used in this text as an open limitation that does not exclude the existence of also other features in addition to those that are literally mentioned.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION

It is obvious to a person skilled in the art that with the advancement of technology, the basic idea of the invention may be implemented in various ways. The invention and its embodiments are thus not limited to the examples described above, instead they may vary within the scope of the claims.

The embodiments of the invention are meant for use in integrated circuits in which digital data is processed in pipelines consisting of sequences of combinational logic units. In particular, embodiments of the invention are meant for use as register circuits that are used to temporarily store digital values obtained from an output of a preceding circuit element, for example from an output of a preceding combinational logic unit. Temporary storing means here that the output value of the preceding circuit element is read into the register circuit and made (and kept) available at the output of the register circuit for a duration of time that is determined by a triggering signal, which for synchronous circuits is typically called a clock signal. Without losing generality the term "clock" signal can be used also for asynchronous circuits, and in this description these terms are used essentially as synonyms of each other.

Embodiments of the invention are generally categorized as register circuits of flip-flop type. This means that when the timing of the processing goes as intended, the digital value at the data input of the register circuit settles before an allowable time limit defined by a triggering edge of the clock signal, and the data output of the register circuit is locked to that value at the triggering edge. The allowable time limit is not at the triggering edge but slightly before it; the shortest allowable interval between the allowable time limit and the triggering edge is called the setup time of the register circuit of flip-flop type. Since the setup time is (essentially) constant and characteristic to the register circuit in question, the triggering edge of the clock signal may be said to "define" the allowable time limit, because the allowable time limit is always one setup time earlier than the triggering edge. The setup time is only a small fraction of the half cycle of the clock signal.

Figure 1:
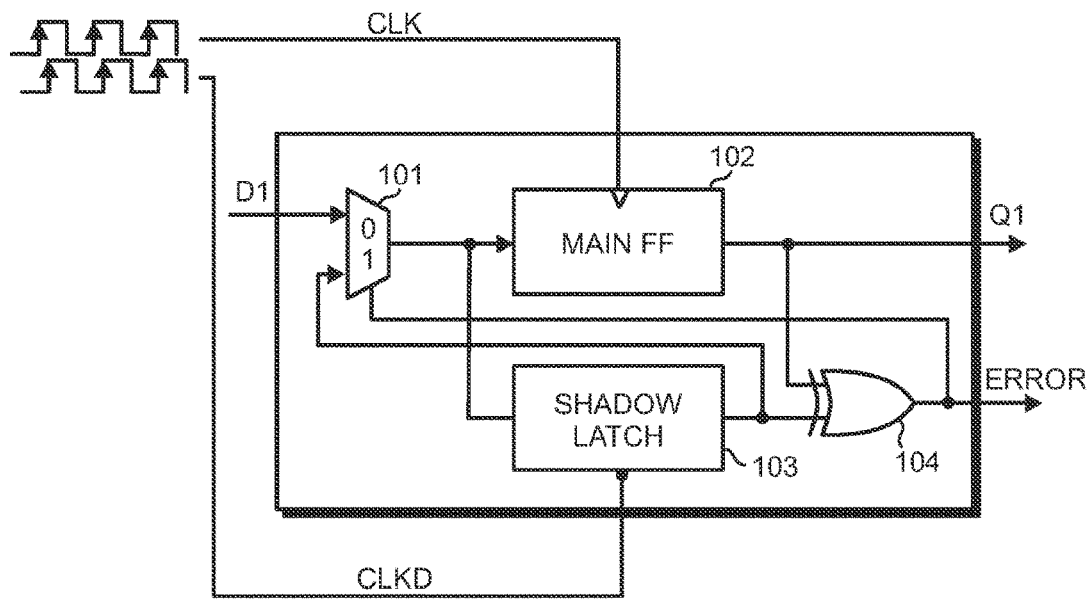
FIG. 1 illustrates a prior art register circuit.
Figure 2:
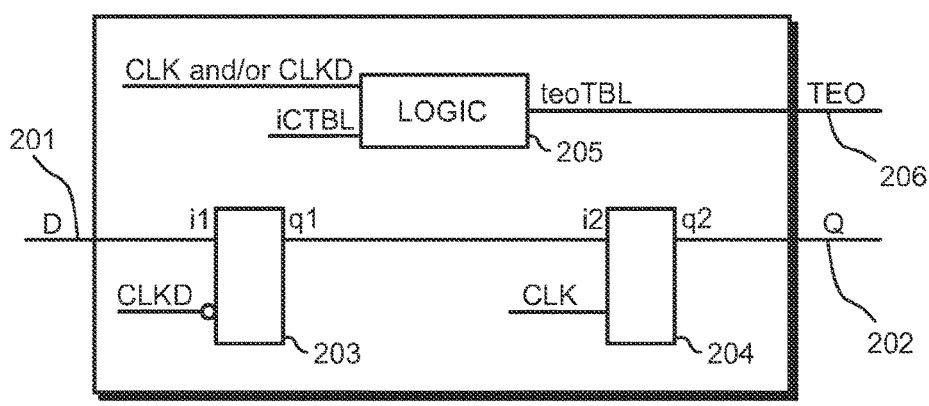
FIG. 2 illustrates a principle of a time borrowing register circuit of flip-flop type.

FIG. 2 illustrates schematically a register circuit of flip-flop type for temporarily storing a digital value obtained from an output of a preceding circuit element. The preceding circuit element is not shown in FIG. 2, but the register circuit is seen to comprise a data input 201 for receiving the digital value for temporary storage. The register circuit comprises also a data output 202 for outputting the temporarily stored digital value, i.e. for making it available for a subsequent circuit element. Typically the preceding and subsequent circuit elements are combinational logic units that belong to a pipeline within an integrated circuit. Capital letters D and Q are used to denote the signals at the data input 201 and the data output 202 respectively, according to conventional notation.

On the data propagation path between the data input 201 and data output 202 there is a sequence of a first pulse-enabled subregister stage 203 and a second pulse-enabled subregister stage 204. Being pulse-enabled, the first and second subregister stages are transparent in the sense that whenever their enabling pulse is active, any change in the input of the respective pulse-enabled subregister stage is immediately reflected at its output. When the enabling pulse is not active, the output of the pulse-enabled subregister stage maintains the value it had when the enabling pulse was active last time, and is insensitive to any changes in its input value until the enabling pulse goes active again. Being in sequence on the data propagation path between the data input 201 and data output 202 means that data coming to the data input 201 must pass through the first pulse-enabled subregister stage 203 and the second pulse-enabled subregister stage 204 in this order before becoming available at the data output 202.

If a conventional flip-flop has first and second pulse-enabled subregister stages concatenated on a data propagation path, these are typically clocked with opposite phases of the same clock signal. In the register circuit of FIG. 2 the first pulse-enabled subregister stage 203 is configured to receive, in its enabling input, the clock signal phase-inverted but also delayed with respect to the clock signal that the second pulse-enabled subregister stage 204 receives in its enabling input. The length of the delay is a fraction of a cycle of the clock signal. A number of implementation principles exist for producing such a delayed clock signal to the first pulse-enabled subregister stage 203, and these will be explained in more detail later in this text. The delay is emphasized in the name of the signal CLKD (like "clock, delayed") that goes to the (inverted) enabling input of the first pulse-enabled subregister stage 203.

The register circuit of FIG. 2 comprises a triggering event input of some kind, although one is not explicitly shown in FIG. 2 in order to preserve generality in view of the different implementation principles referred to above. The triggering event input is meant for receiving a triggering signal, edges of which constitute triggering events to the register circuit. In synchronous circuits the triggering signal brought to the triggering event input 203 is frequently referred to as the clock signal. The term clock signal can be used also in asynchronous circuits in order to emphasize that it is a signal, the edges of which have major significance, where an "enabling" signal is typically one, the pulses (high or low levels) of which have major significance. In this description the term clock signal is used for consistency to mean a triggering signal, edges of which constitute triggering events to the register circuit. The term clock input is used for an input that a register circuit has for receiving a clock signal.

With these generalizations in mind it can be said that a triggering edge of the clock signal defines an allowable time limit before which a digital value must appear at the data input 201 to become temporarily stored according to the normal, expected operation of the register circuit.

Additionally the register circuit of FIG. 2 comprises a timing event observation logic 205, which is configured to output a timing event observation signal TEO at an output 206 of the register circuit. The TEO signal is an indicator of the digital value at the data input 201 having changed within a time window that begins at the allowable time limit explained above and is shorter than one cycle of the clock signal. Various ways exist for making the timing event observation logic 205 aware of a late change taking place in the input data signal, and such ways are described later in this text. Generally it may be said that the timing event observation logic 205 needs some input signals for making its observations; examples of such input signals are shown with the names iCTBL and CLK and/or CLKD.

Figure 3:
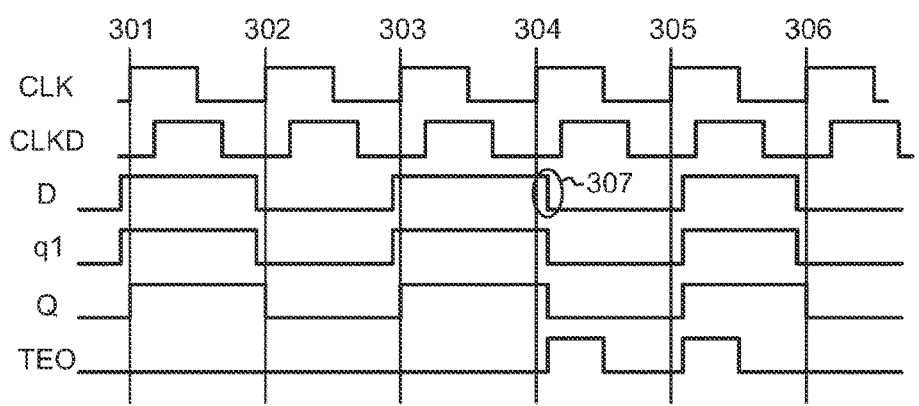
FIG. 3 illustrates a timing diagram of certain signals in a register circuit according to FIG. 2.

We may first assume that the register circuit of FIG. 2 is a single edge triggered flip-flop and that the first and second pulse-enabled subregister stages 203 and 204 are latches. FIG. 3 illustrates the timing of certain signals in an arbitrary example case. The topmost line illustrates the CLK signal that alternatingly enables and disables the second latch, and the CLKD line illustrates the delayed clock signal, the inverse of which alternatingly enables and disables the first latch.

The D line illustrates an arbitrary passage of an input data signal, which in this example changes its value once in every clock cycle. The changes of input data associated with moments 301, 302, 303, and 306 arrive in time, while the changes of input data associated with moments 304 and 305 are late. The allowable time limit of the register circuit is not separately shown in FIG. 3. A conventional, simplified notation is used in which all changes in input data that are shown to the left of the moment of the triggering edge in the CLK signal are considered as coming in time, and changes in input data that are shown to the right of the moment of the triggering edge in the CLK signal are considered as coming late.

Since the first latch remains enabled whenever the CLKD signal is low, its output signal q1 follows the incoming data signal at all changes in FIG. 3—it is assumed in FIG. 3 that even if the changes of input data associated with moments 304 and 305 are late, they still come within the time window that begins at the allowable time limit and is shorter than one cycle of the clock signal. In particular, the length of the time window equals the phase difference of the CLK and CLKD signals; in other words, it equals the length of the delay in the CLKD signal in relation to the CLK signal. Thus in order to come within said time window a change in the input data must occur after the triggering (rising) edge in the CLK signal but before the immediately following rising edge in the CLKD signal in FIG. 3.

At moment 304 the first latch is still enabled, because the CLKD signal is low. Even at the time of the late change 307 in the input data signal the first latch is still enabled, because—as explained above—despite being late the change 307 comes before the time window closes at the immediately following rising edge in the CLKD signal. The output signal q1 of the first latch goes low and stays low when the first latch is disabled by the CLKD signal going high. Meanwhile the second latch has been enabled by the high value or the CLK signal, so its output follows the falling edge of q1 and the changed value of input data becomes available as a corresponding value in the output signal Q of the whole register circuit, even if it was not on time (not simultaneous with the triggering edge in the clock signal at moment 304) but slightly late.

The fact that the value of i1 (and correspondingly q1) remained unchanged even at moment 304 does not tell as such, whether this was because a change in the input data signal D was late or whether the value of D will simply stay unchanged in this clock cycle. Thus at moment 304 sharp the timing event observation logic 205 does not know yet, whether there was a timing event or not. However, when the late change 307 in input data then takes place within the time window, the timing event observation logic 205 notices this and makes the TEO signal active. The next time when the timing event observation logic 205 must be ready to detect any eventual timing event is at the next triggering (rising) edge of the CLK signal, so it is advantageous to reset the TEO signal before that, for example at the falling edge of the CLK signal in the middle between moments 304 and 305 like in FIG. 3.

Indeed there comes another timing event associated with moment 305 in FIG. 3, so essentially the same chain of events repeats: the first latch reads in the late changing input data D, the second latch makes the corresponding value available in the output data Q if only somewhat late, and a pulse is produced in the TEO signal as an indicator of a timing event having been detected.

Figure 4:
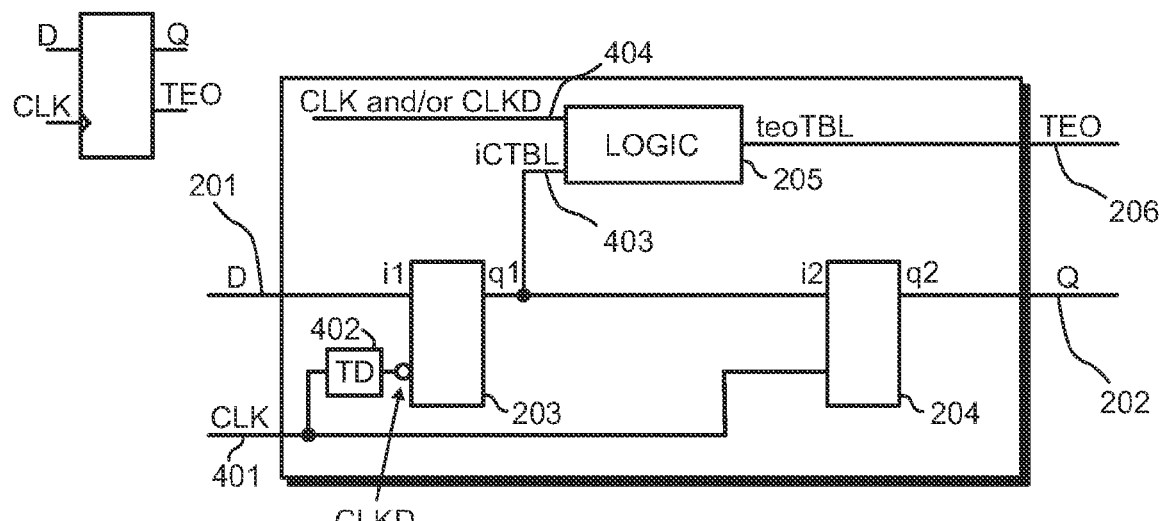
FIG. 4 illustrates a register circuit according to an embodiment.
Figure 5:
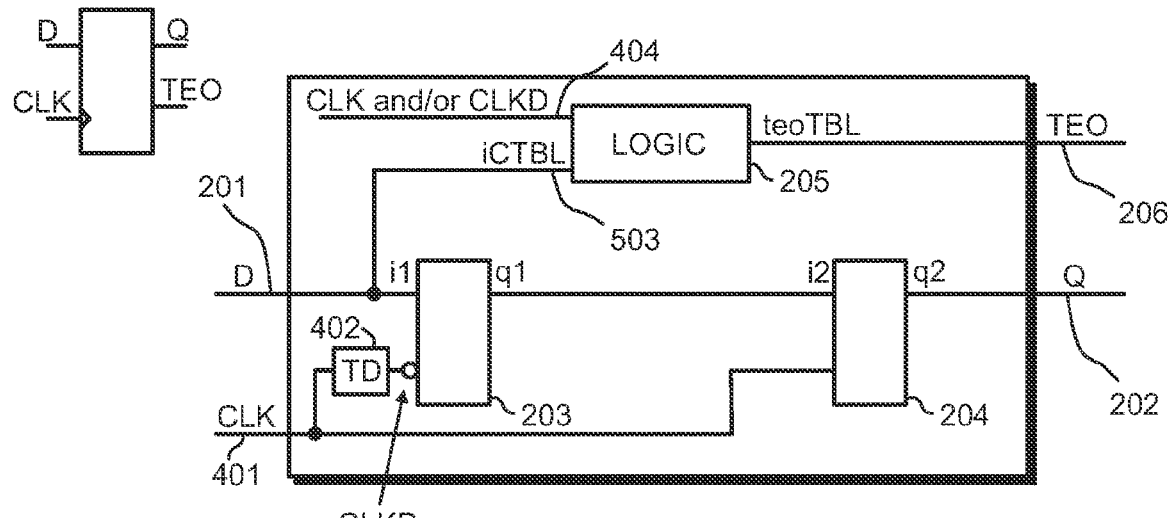
FIG. 5 illustrates a register circuit according to an embodiment.

FIGS. 4 and 5 are examples of embodiments in which the register circuit comprises a clock input 401 for receiving the (undelayed) clock signal from a clock tree of the integrated circuit of which the register circuit is a part, and a delay element 402 between the clock input 401 and the enabling input of the first pulse-enabled subregister stage 203. The delay element 402 may be a simple delay line of fixed length, consisting of e.g. a number of consecutive inverters. In a somewhat more sophisticated embodiment the delay element 402 may be configured to implement a delay of controllable length, so that the length of the delay may depend on a selection signal or control signal generated by a controlling element either within the register circuit or somewhere else in the integrated circuit of which the register circuit is a part. A simple controllable-length delay line is one where a number of consecutive inverters is augmented with a multiplexer, inputs of which are coupled to various points between the inverters so that the selection signal of the multiplexer defines, how many inverters the signal must pass through before becoming available at the multiplexer output.

In the embodiment of FIG. 4 the timing event observation logic 205 comprises a first input 403 coupled to receive a value on the data propagation path between the first and second pulse-enabled subregister stages 203 and 204, and a second input 404 coupled to receive either the clock signal CLK or the delayed clock signal CLKD or both. From the clock signal(s) it receives, the timing event observation logic 205 is configured to deduce the beginning and end of the time window during which it must detect the timing events. Since the first pulse-enabled subregister stage 203 remains enabled (and transparent) until the end of the enabling pulse in the delayed clock signal CLKD, the timing event observation logic 205 may monitor, whether the output signal q1 of the first pulse-enabled subregister stage 203 changes within the time window. If it does, a timing event observation signal TEO is given at the output 206.

In the embodiment of FIG. 5 the timing event observation logic 205 comprises a first input 503 coupled to receive a value on the data propagation path before the first pulse-enabled subregister stage 203, and a second input 404 coupled to receive either the clock signal CLK or the delayed clock signal CLKD or both. The operation of the timing event observation logic 205 may be quite similar in FIG. 5 to that in FIG. 4, because the signals i1 and q1 before and after the first pulse-enabled subregister stage 203 are essentially copies of each other, save some propagation delay within the first pulse-enabled subregister stage 203, until the end of the time window during which the timing events are to be detected.

A hybrid embodiment could be presented where the timing event observation logic 205 would have parallel inputs for receiving values on the data propagation path both before and after the first pulse-enabled subregister stage 203. Such an embodiment could involve the advantage that the timing event observation logic 205 could arrive at the correct result even in cases where the timing event took place so close to the end of the time window that it would be uncertain, whether the first pulse-enabled subregister stage 203 had been disabled already, i.e. whether the change in the input data value made it through the first pulse-enabled subregister stage 203. Since such a timing event represents already a relatively long delay in receiving the change in the input data signal, possibly necessitating significant corrective action in the whole integrated circuit, the timing event observation logic 205 may be configured to output a special kind of an indicator signal in such situations. Another possible reason for equipping the timing event observation logic 205 with parallel inputs for both i1 (=D) and q1 might be that this way the timing event observation logic 205 can be designed in a particularly advantageous way.

Figure 6:
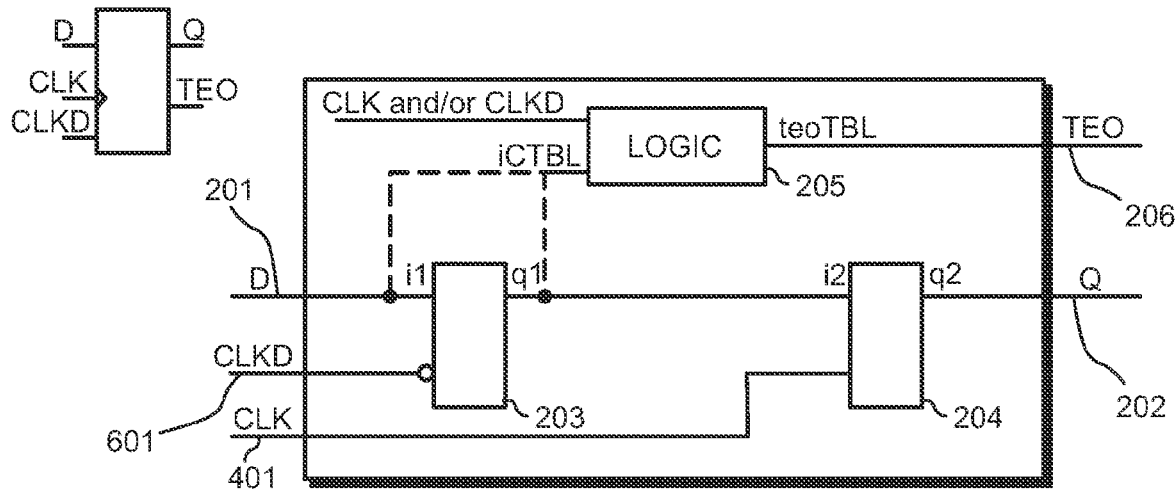
FIG. 6 illustrates a register circuit according to an embodiment.

The embodiment shown in FIG. 6 differs from those of FIGS. 4 and 5 in that although it also comprises a clock input 401 for receiving an external clock signal, the delayed clock signal is not derived from the received clock signal internally within the register circuit. Instead, the register circuit comprises a delayed clock input 601 for receiving a separate delayed version CLKD of the clock signal CLK. The register circuit comprises a coupling from the delayed clock input 601 to the (enabling input of) the first pulse-enabled subregister stage 203.

Compared to those embodiments in which the delayed clock signal is derived internally within the register circuit, the embodiment of FIG. 6 involves the inherent advantages that the register circuit itself is simpler and that the length of the time window, during which timing events are to be detected, can be decided elsewhere in the integrated circuit and even changed centrally and dynamically, if needed. However, delivering a delayed clock signal in addition to the regular clock signal to register circuits naturally necessitates building a separate clock tree within the integrated circuit. Intermediate embodiments may be presented in which for example a number of register circuits share a common delay line for deriving the delayed clock signal, so that the clock tree of the integrated circuit only needs to deliver one clock signal very close to the register circuits, where the delayed clock signal is then derived and distributed locally.

As is shown with dashed lines and the and/or conjunction in FIG. 6, inputs to the timing event observation logic 205 may comprise any combination of the clock signal CLK, delayed clock signal CLKD, value on the data propagation path between the first and second pulse-enabled subregister stages, and value on the data propagation path before the first pulse-enabled subregister stage. In this respect the possible implementations and variations of operation of the timing event observation logic 205 do not need to differ from those explained already above with reference to FIGS. 4 and 5.

Figure 7:
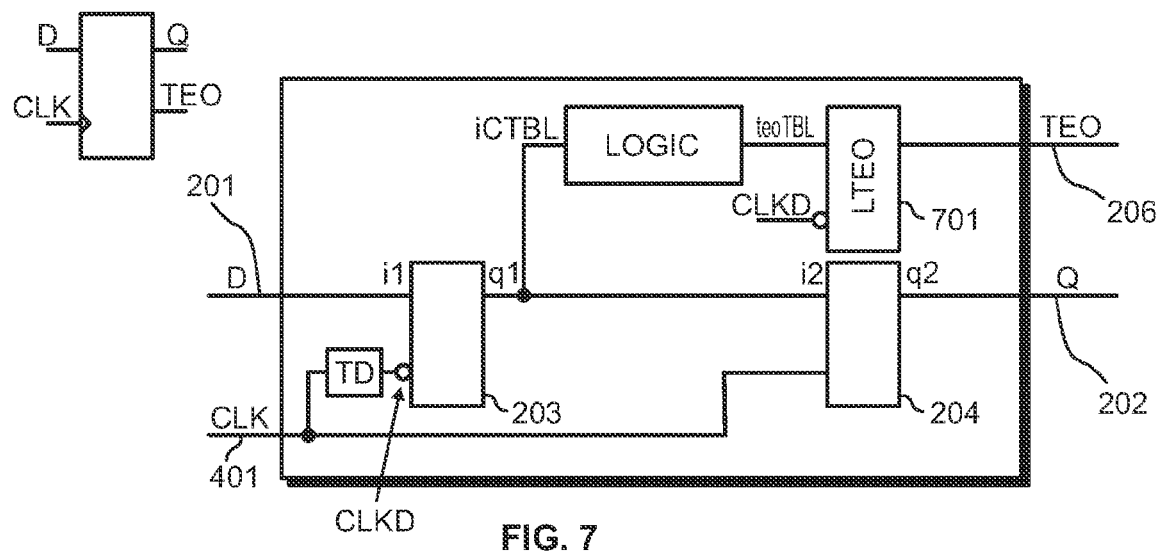
FIG. 7 illustrates a register circuit according to an embodiment.

FIG. 7 illustrates an embodiment in which a clocked latch 701 is used as a part of the functional part of the register circuit that can be generally described as the timing event observation logic. The signal teoTBL that represents a detected timing event is taken to the data input of the clocked latch 701, the enabling signal of which is an inverse of the delayed clock signal CLKD in FIG. 7. When a latch is used to produce the TEO output signal of the register circuit like in FIG. 7, it may happen that the TEO signal remains active for such a long time that it may become challenging to resolve, based on the TEO signal alone, whether the timing event concerned a single triggering edge of the clock signal or whether it persisted over two consecutive clock signals. Suitable signal processing in the external circuit elements (not shown in FIG. 7) that receive and react upon the TEO signal, as well as information from other parts of the pipeline, may be used for such resolving.

Figure 8:
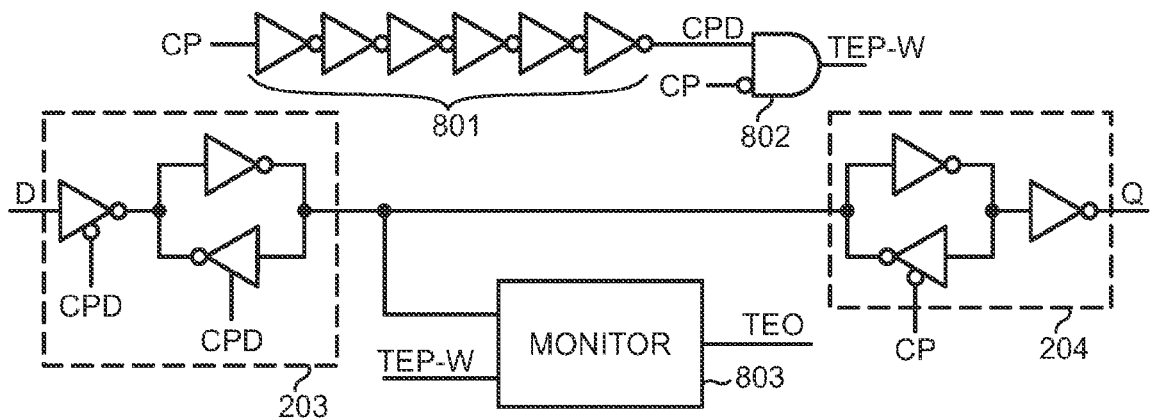
FIG. 8 illustrates a register circuit according to an embodiment.
Figure 9:
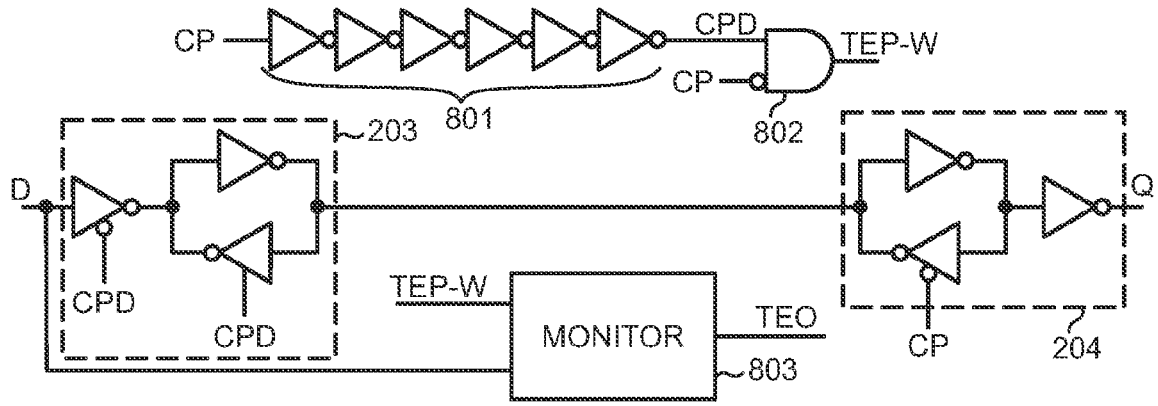
FIG. 9 illustrates a register circuit according to an embodiment.

FIGS. 8 and 9 illustrate embodiments in which the first and second pulse-enabled subregister stages 203 and 204 are made of pairs of back-to-back coupled inverters. The clock signal is marked as CP (clock pulse), which emphasizes the fact that the duty cycle of the pulsed signal that is used to cyclically enable and disable the first and second pulse-enabled subregister stages does not need to be 50%.

The pulsed clock signal CP is taken as such to clock the second pulse-enabled subregister stage 204. A delayed form CPD (clock pulse, delayed) of the pulsed clock signal is produced in a delay line 801, which in FIGS. 8 and 9 consists of an even number of consecutive inverters. The delayed pulsed clock signal CPD is taken to a non-inverting input of an AND gate 802, which receives the pulsed clock signal CP in an inverting input. The output signal from the AND gate 802 is a timing event pulse window (TEP-W) signal that goes high whenever the CP is low and the CPD is high simultaneously. Thus the TEP-W signal can define the time windows during which timing events are to be detected.

The monitor circuit 803 in FIGS. 8 and 9 is essentially a timing event observation logic, and it may receive its input data signal either after the first pulse-enabled subregister stage (as in FIG. 8) or before it (as in FIG. 9). Another input to the monitor circuit 803 is the TEP-W signal, and the output of the monitor circuit 803 is the TEO signal. In this respect the embodiments of FIGS. 8 and 9 are very much comparable to those of FIGS. 4 and 5.

In the embodiments described so far it has been assumed that the register circuit is of the single edge triggered flip-flop type. However, the same principle can be applied to register circuits that are of the double edge triggered flip-flop type.

Figure 10:
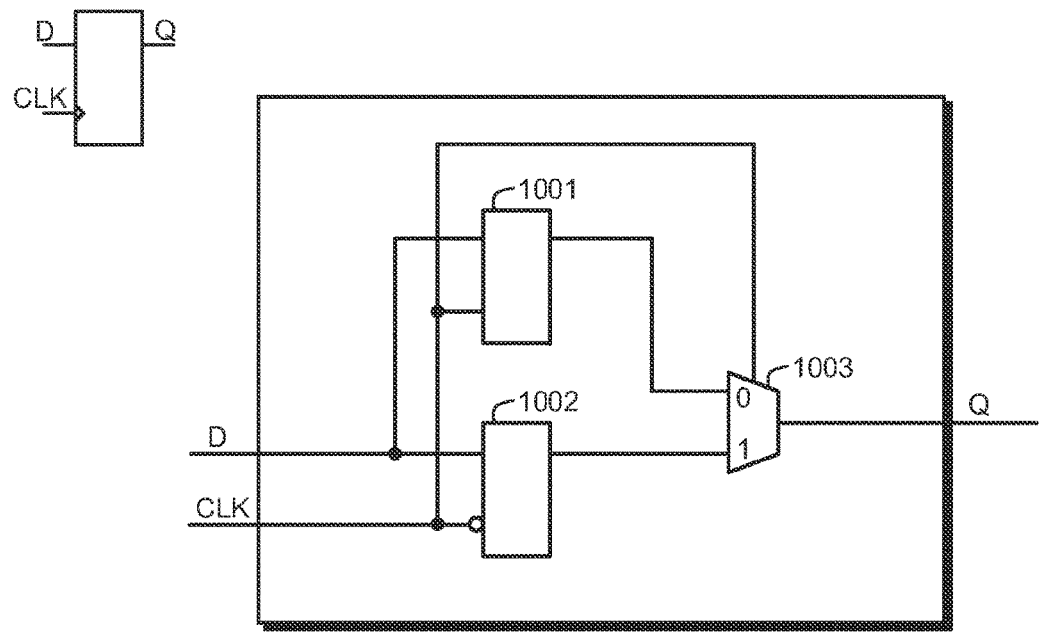
FIG. 10 illustrates a general principle of a double edge triggered flip-flop.

FIG. 10 illustrates a standard double edge triggered flip-flop that is not capable of dealing with timing events. It comprises a data input for receiving an input data signal D, and a data output for outputting an output data signal Q, as well as a clock input for receiving a clock signal CLK. The first pulse-enabled subregister stage of the register circuit of FIG. 10 comprises first and second parallel latch branches clocked at opposite phases of the clock signal CLK. The upper latch branch comprises a clocked latch 1001, and the lower latch branch comprises a clocked latch 1002. The data inputs of each of these are coupled to the data input of the whole register circuit.

The second pulse-enabled subregister stage of the register circuit in FIG. 10 comprises a multiplexer 1003 clocked by the same clock signal CLK as the clocked latches 1001 and 1002 of the first pulse-enabled subregister stage. The data outputs of the clocked latches 1001 and 1002 are coupled to the respective inputs of the multiplexer 1003. When the clock signal CLK is low, only the lower clocked latch 1002 is enabled and reads in changes in the input data D, while the output data D has the value that was most recently stored in the upper clocked latch 1001, and vice versa.

Concerning late-arriving changes in the input data D, the standard double edge triggered flip-flop of FIG. 10 has the same problems as a standard single edge triggered flip-flop. For example, if a change in input data that should have occurred while the clock signal CLK was low is late, it arrives only when the clock signal CLK has gone high already. At that time only the upper clocked latch 1001 is enabled, but the multiplexer 1003 selects the value from the lower branch, which is the value that the lower clocked latch 1002 stored before the most recent change in input data, and thus incorrect.

Figure 11:
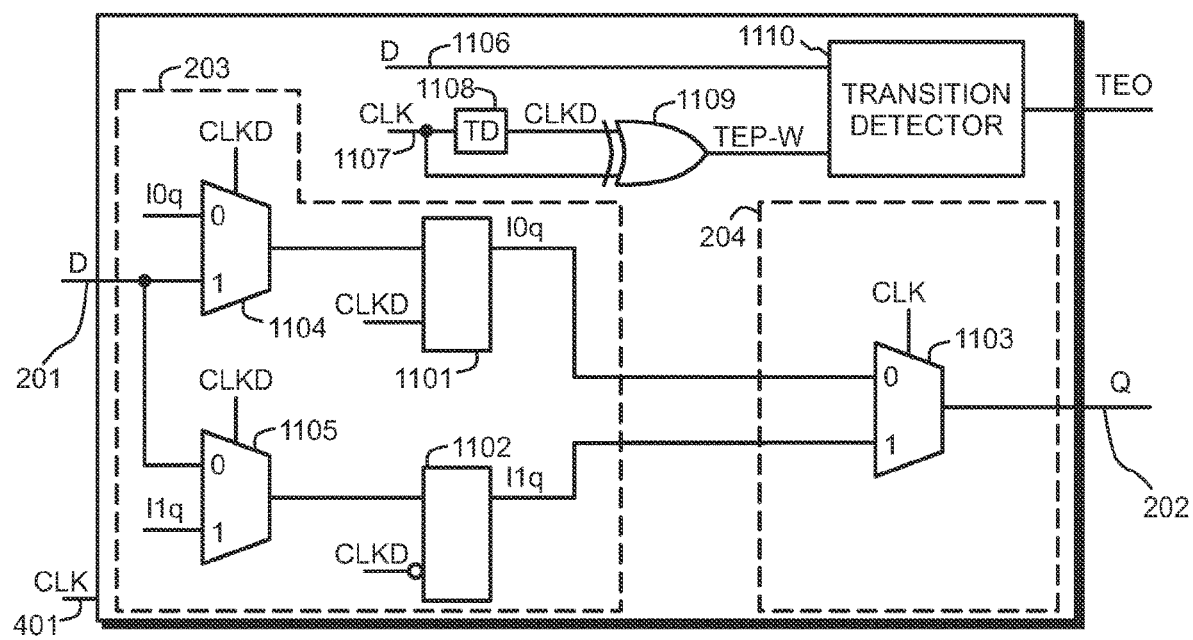
FIG. 11 illustrates a register circuit according to an embodiment.

FIG. 11 illustrates a register circuit of the double edge triggered flip-flop type that is capable of dealing with timing events according to the principle of the invention. In the register circuit of FIG. 11 the first pulse-enabled subregister stage 203 comprises two parallel branches of the data propagation path. Each of the parallel branches comprises a latch, and to reflect their positions in the graphical representation of FIG. 11 they can be called the upper latch 1101 and the lower latch 1102 respectively. The upper and lower latches 1101 and 1102 are clocked at opposite phases of the delayed clock signal CLKD.

In the register circuit of FIG. 11 the second pulse-enabled subregister stage 204 comprises a multiplexer 1103 configured to alternatingly couple the data outputs of the first and second latches 1101 and 1102 to the data output 202 of the register circuit at opposite values of the clocking signal CLK.

The data input 201 of the register circuit is coupled to the data inputs of the upper and lower latches 1101 and 1102 through respective multiplexers 1104 and 1105 that are clocked by the delayed clock signal CLKD. The arrangement and selecting of the inputs of the multiplexers 1104 and 1105 is such that on a high value of the delayed clock signal CLKD the data input 201 is coupled through multiplexer 1104 to the data input of the upper latch 1101, the enabling input of which is coupled to receive the delayed clock signal CLKD as such. On the high value of the delayed clock signal CLKD the data input of the lower latch 1102 is coupled to receive a feedback signal $11q$ from the data output of the lower latch 1102 itself. On a low value of the delayed clock signal CLKD the data input 201 is coupled through multiplexer 1105 to the data input of the lower latch 1102, while the data input of the upper latch is coupled to receive a feedback signal $10q$ from the data output of the upper latch 1101 itself. The enabling input of the lower latch 1102 is coupled to receive the inverse of the delayed clock signal CLKD.

As an example, if a change in input data should arrive to the register circuit of FIG. 11 before a rising edge of the clock signal CLK but comes late, the delayed clock signal CLKD is still low when it arrives. The lower multiplexer 1105 passes the late-arriving change in input data through to the lower latch 1102, which was still enabled and makes the changed input data available at its output $11q$. The output multiplexer 1103 takes care that always the appropriate one of the two parallel branches is coupled to provide the output signal Q of the register circuit.

The upper part of the register circuit in FIG. 11 illustrates an example of a timing event observation logic. It comprises a timing event (TE) data input 1106 coupled to the data input 201 of the register circuit, and a TE clock input 1107 coupled to the clock input 401 of the register circuit. Additionally it comprises a TE delay element 1108 coupled to the TE clock input 1107 and configured to delay the clock signal CLK received at the TE clock input by the length of the delay that should constitute the time window for late-arriving changes in input data. An XOR gate 1109 is coupled to the TE clock input 1107 and the TE delay element 1108 and configured to produce an active timing window indicator signal TEP-W whenever the values received from the TE clock input 1107 and the TE delay element 1108 are unequal.

A transition detector 1110 is coupled to the TE data input 1106 and to the output of the XOR gate 1109. It is configured to produce the timing event observation signal TEP in response to the value in the TE data input 1106 changing while the timing window indicator TEP-W is active.

The timing event observation logic of FIG. 11 can be used also in the other embodiments of the invention described earlier, where a timing event observation logic was illustrated only in a more schematic fashion.

Figure 12:
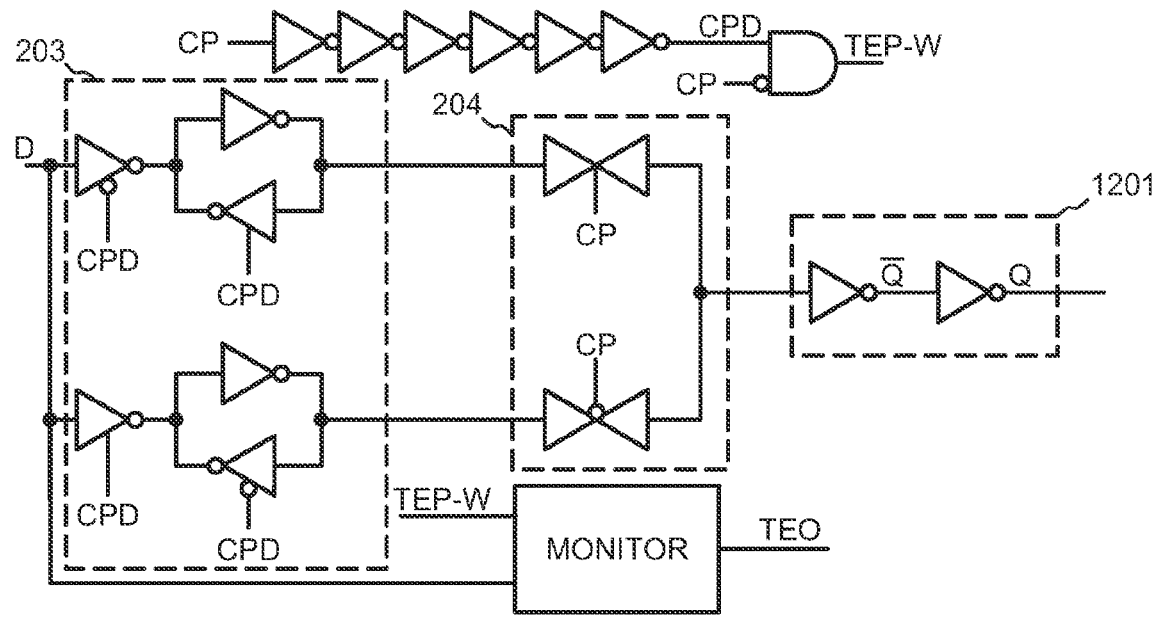
FIG. 12 illustrates a register circuit according to an embodiment.
Figure 13:
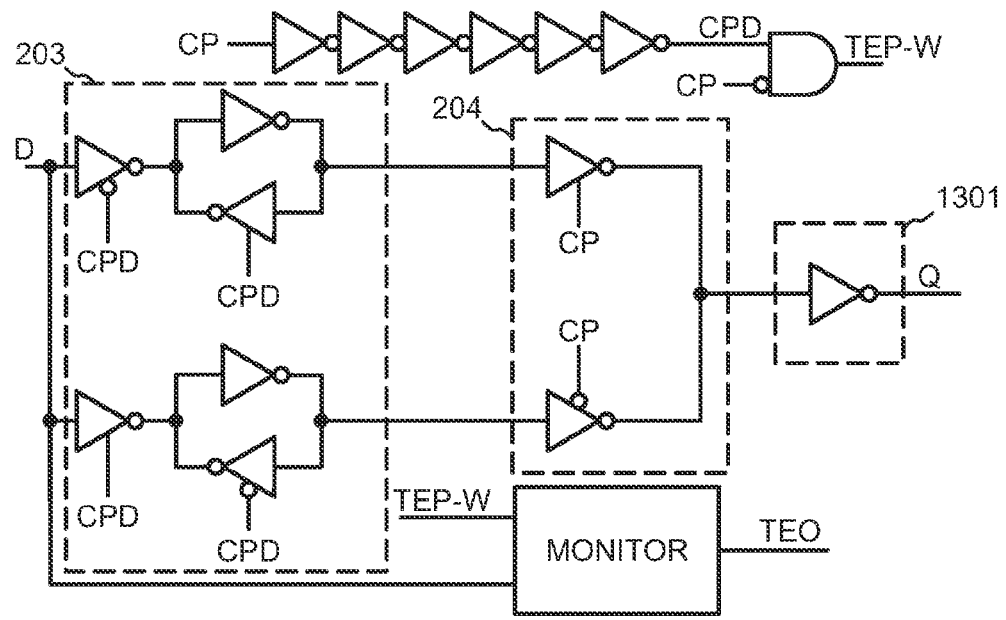
FIG. 13 illustrates a register circuit according to an embodiment.

FIGS. 12 and 13 show some examples of how the principle of FIG. 11 can be implemented in practice using only relatively simple basic building blocks. In both FIG. 12 and FIG. 13 the first pulse-enabled subregister stage 203 has the latches implemented as back-to-back couplings of controllable inverters. In FIG. 12 the second pulse-enabled subregister stage 204 consists of parallel transmission gates clocked at opposite phases of the clock signal CP, while in FIG. 12 also the second pulse-enabled subregister stage 204 is implemented with controllable inverters. The additional inversion of data in the second pulse-enabled subregister stage 204 of FIG. 13 is compensated for by making the output buffer 1301 of the register circuit comprise only a single inverter, while the output buffer 1201 of FIG. 12 consists of two inverters in series.

Clock gating is a technique used in integrated circuits to save energy by avoiding unnecessary changes of state. If digital data is processed in a pipeline where the intermediate results given by combinational logic units are stored in registers, it may happen that the intermediate result stored in a particular (set of) register(s) does not change at all at a certain triggering edge, or even at a number of consecutive triggering edges. In such a case it is advisable to temporarily disable the clocking of the subsequent stages in the same pipeline, because their outputs would remain the same anyway.

Figure 14:
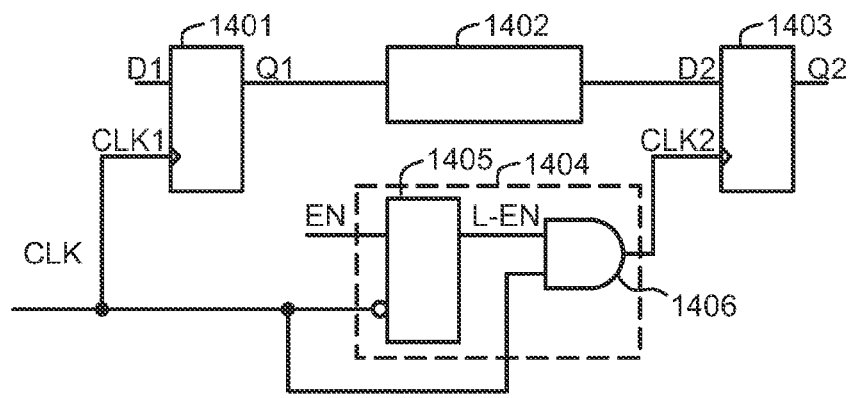
FIG. 14 illustrates a general principle of clock gating.

FIG. 14 shows a basic example of a pipeline in which clock gating is used. A first register circuit 1401 is clocked with a clock signal CLK. Its output serves as the input of a subsequent combinational logic unit 1402, the output of which is in turn stored in the second register circuit 1403. The clock signal to the second register circuit 1403 is derived from that of the first register circuit 1401 by taking it through a clock gating cell 1404.

Figure 15:
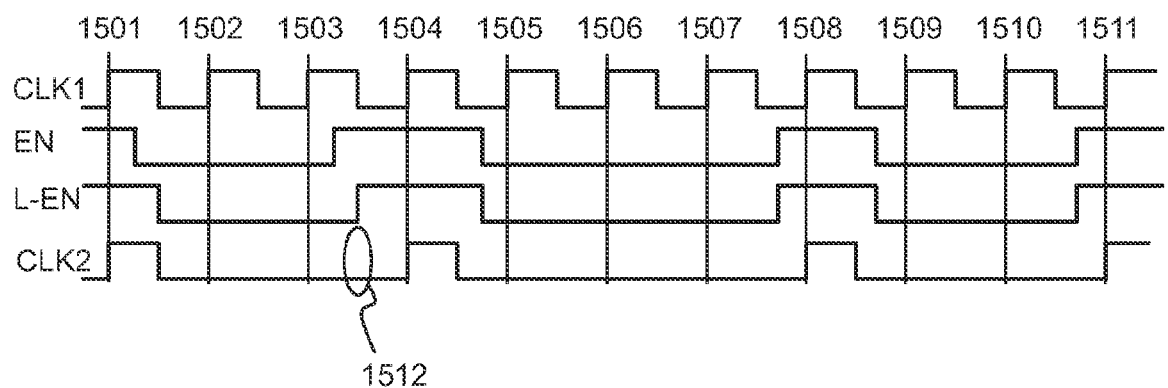
FIG. 15 is a timing diagram of certain signals in a clock gating arrangement according to FIG. 17.
Figure 16:
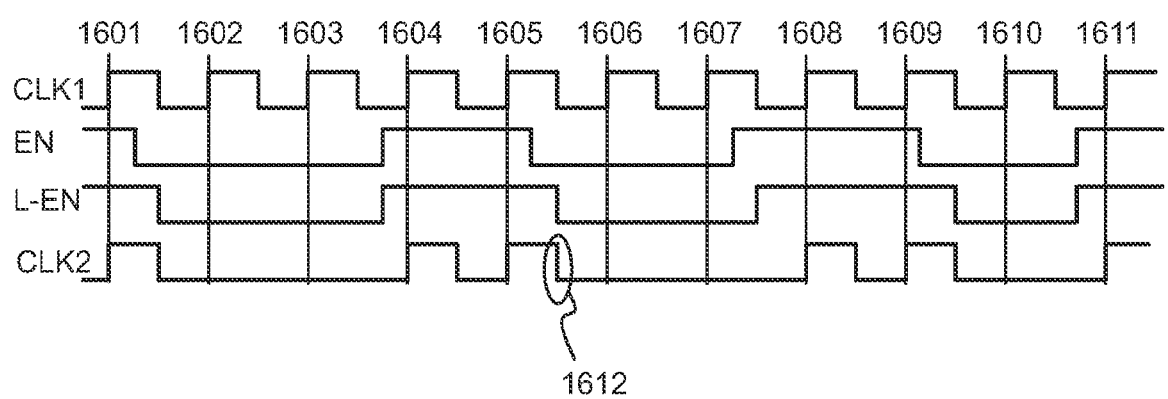
FIG. 16 is a timing diagram of certain signals in a clock gating arrangement according to FIG. 17.

FIGS. 15 and 16 illustrate examples of gating the clock signal in the pipeline of FIG. 14. When the EN signal goes low at the first time in FIG. 15, right after moment 1501, the clock signal CLK1 of the first register circuit 1401 (and consequently also the clock signal CLK2 of the second register circuit 1403) is high. The latch 1405 in the clock gating cell 1404 becomes enabled on the next falling edge of the CLK1 signal and reads in the low state of the EN signal; the AND gate 1406 in the clock gating cell now gets two low outputs so CLK2 goes low. The rising edge of the EN signal after moment 1503 does not immediately cause any reaction in the CLK2 signal, because first the latched enable signal L-EN is still low and then when it goes high, the CLK1 signal is low in turn. Only at the rising edge of the CLK1 signal at moment 1504 the CLK2 signal goes also high, and so on.

The clock gating of FIGS. 15 and 16 works well, if the register circuits 1401 and 1403 in the pipeline are of the single edge triggered flip-flop type. Successful clock gating means that each register circuit receives equally many triggering edges whenever the EN signal is high. We may assume first that the register circuits 1401 and 1403 are triggered by the rising edges of their respective clock signals. Counting the rising edges in both CLK1 and CLK2 in FIGS. 15 and 16 gives equal results whenever the EN signal is high.

However, let us then assume that the register circuits 1401 and 1403 are of the double edge triggered flip-flop type that was generally described earlier with reference to FIG. 14. Now some triggering edges may go missing from the second clock signal CLK2, as in FIG. 15 at the location marked as 1512: during the first whole pulse when the EN signal is high in FIG. 15 there are three edges (rising or falling) altogether in CLK1, but only two in CLK2. Alternatively or additionally it may happen that additional clock edges appear in the second clock signal CLK2: in FIG. 16, the falling edge marked as 1612 is "superfluous", because during the first whole high pulse in the EN signal in FIG. 16 there are three edges in CLK1 but four in CLK2.

It is an objective of the invention to present a method and circuit for performing clock gating for register circuits of the double edge triggered flip-flop type so that a proper number of triggering edges can be ensured in all occasions. It is a further objective of the invention to present such a method and circuit that are well suited for register circuits that are not only of the double edge triggered flip-flop type but also capable of time borrowing.

Said objectives of the invention are achieved by making the clock gating circuit remember its state at the last moment of disabling and to continue from there at each edge of the ungated clock signal, allowing the phase of the gated clock signal to invert if necessary.

It is characteristic to a clock gating circuit of the kind referred to here that the clock gating circuit is configured to freeze the toggling (gated) clock signal at its current value in response to an enabling signal assuming the value that disables delivering said toggling clock signal, and to respond to said enabling signal thereafter assuming the value that enables delivering said toggling clock signal by beginning the continued toggling of said toggling clock signal at the next edge of the input clock signal.

It is characteristic to a clock gating method of the kind referred to here that it comprises freezing the toggling (gated) clock signal at its current value in response to an enabling signal assuming the value that disables delivering said toggling clock signal, and responding to said enabling signal thereafter assuming the value that enables delivering said toggling clock signal by beginning the continued toggling of said toggling clock signal at the next edge of the input clock signal.

The inventive method and circuit for clock gating are based on the insight that for clocking double edge triggered flip-flops it is actually not necessary to require the clock signal to have the same phase. Also oppositely phased clock signals will work, at least as long as it can be ensured that the structure of the double edge triggered flip-flops can prevent having two transparent register circuits in line enabled simultaneously.

Figure 17:
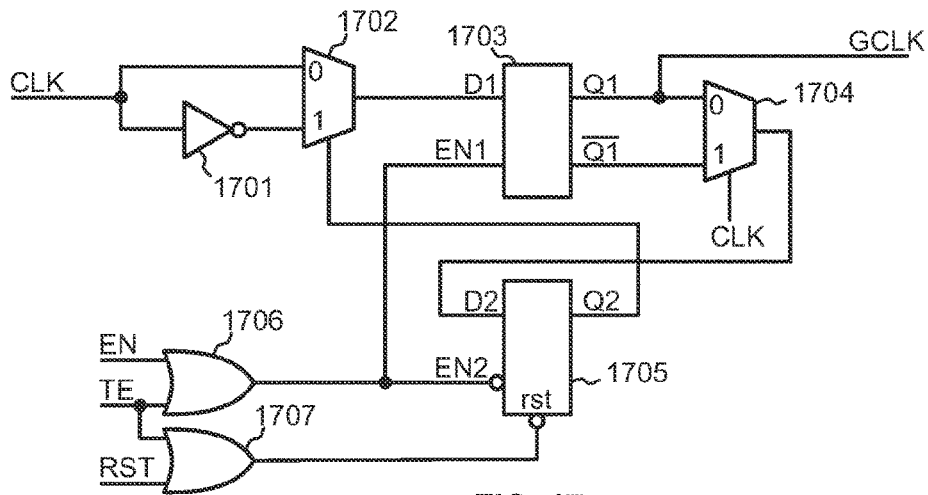
FIG. 17 illustrates a clock gating circuit according to an embodiment.
Figure 18:
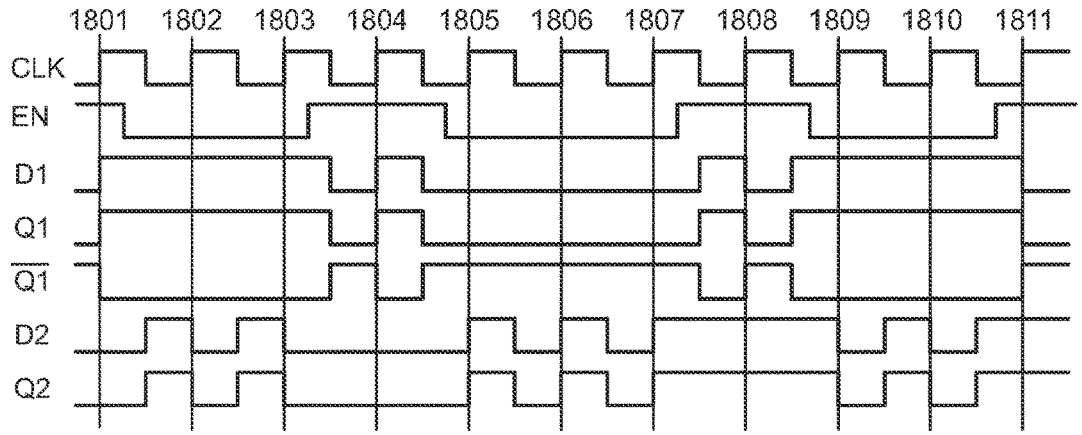
FIG. 18 is a timing diagram of certain signals in a clock gating circuit according to FIG. 20.
Figure 19:
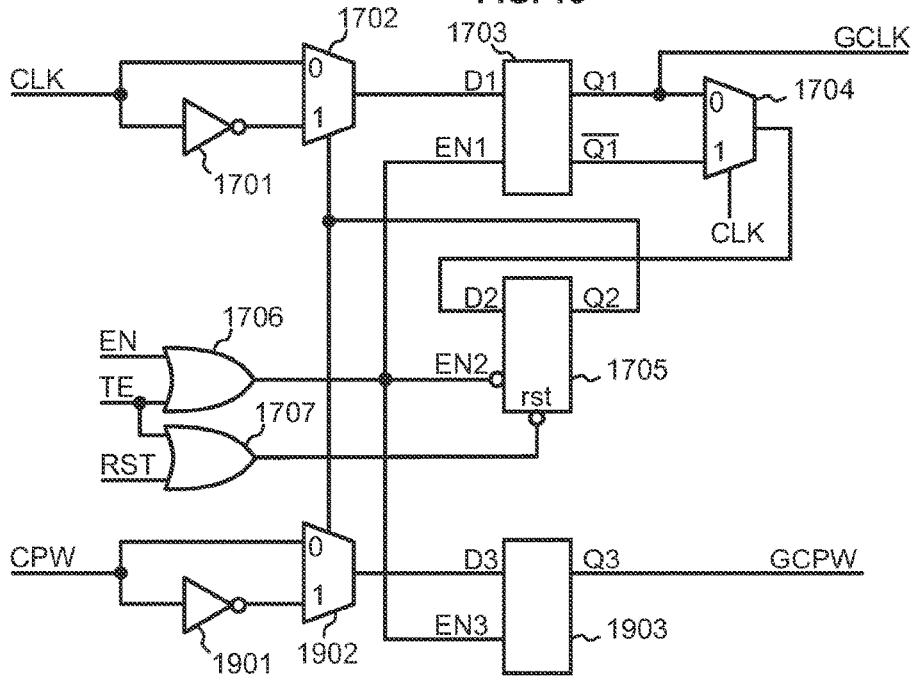
FIG. 19 illustrates a clock gating circuit according to an embodiment.

Clock gating of the kind described above will be discussed in more detail in the following with reference to FIGS. 17 to 19, in which FIG. 17 illustrates a clock gating cell, FIG. 18 illustrates timing of certain signals in the circuit of FIG. 17, and FIG. 19 illustrates a clock gating cell that can also gate a clock pulse window signal.

FIG. 17 illustrates a so-called clock gating cell, which could be used in place of the more conventional clock gating cell 1404 of FIG. 14. The clock signal CLK to be gated comes in through the clock signal input at the top left corner of FIG. 17, and the gated clock signal GCLK goes out of the gated clock signal output at the top right corner. The clock signals are regular toggling digital signals, as is common in integrated circuits that include clocked digital circuit elements.

The incoming CLK signal goes through two parallel branches, one of which comprises an inverter 1701, to the respective inputs of a first multiplexer 1702. The output of the first multiplexer 1702 goes to the data input of a first latch 1703, the non-inverted output of which provides the gated output clock signal GCLK. The last-mentioned is also taken to a first input of a second multiplexer 1704, the other input of which is coupled to receive the inverted output of the first latch 1703. The selection signal of the second multiplexer 1704 is the CLK signal.

The output of the second multiplexer 1704 goes to the data input of a second latch 1705, the (non-inverted) output of which constitutes the selection signal of the first multiplexer 1702. The enabling signal EN could be taken as such to the first latch 1703 and inverted to the second latch 1705; in FIG. 17 also a test enable signal input is provided for a test enable signal TE, and the two (EN and TE) are combined in a first OR gate 1706. The inverted form of a reset signal RST could be taken as such to a reset input of the second latch 1705: in FIG. 17 the RST and TE signals are taken through a second OR gate 1707, the output of which constitutes the inverted reset signal of the second latch 1705.

In the example case of FIG. 18 it is assumed that the EN signal is first high (meaning that the first latch 1703 is enabled and the second latch 1705 is disabled) and the signal Q2 is first low (meaning that the second latch 1705 was reset). Thus initially the CLK signal goes as such through the first multiplexer 1702 to the data input of the first latch 1703 and further to the gated clock signal output.

After moment 1801 the EN signal goes low; generally it can be said that the enabling signal assumes the value that disables delivering the gated clock signal to those clocked digital circuits that would otherwise receive it. This disables the first latch 1703, so its output signal Q1 is frozen at its current value. Simultaneously the second latch 1705 is enabled, so it begins to read the values of its input signal D2. These, in turn, come from the second multiplexer 1704 which, having its input values frozen, repeatedly alternates between passing them through in the rhythm of the input clock signal CLK. As long as the second latch 1705 remains enabled, the alternating values in its data input go through to its data output. The resulting toggling Q2 signal clocks the first multiplexer 1702, which—due to the inverter 1701 in one of its input branches—ensures that the input signal D1 to the first latch 1703 maintains the value it had when the EN signal went low, even if the CLK signal as such continues to toggle all the time.

After moment 1803 the EN signal goes high again. This happens while the signal D2 (and consequently also Q2) was low, so the value of the signal D1 that the now re-enabled first latch 1703 reads at its input comes from the non-inverted input branch of the first multiplexer 1702. No immediate change takes place in the gated output clock signal GCLK (which is line Q1 in FIG. 18), but the toggling of the output gated clock signal continues at the next edge of the input clock signal CLK in the middle between moments 1803 and 1804. This kind of operation is, as such, similar as that performed by a conventional clock gating circuit, as can be seen by comparing the first halves of lines EN and Q1 in FIG. 18 to those of lines EN and CLK2 of FIG. 15.

However, an important difference to conventional clock gating circuits becomes apparent at the end of the gated clock disabling interval that begins after moment 1804 in FIG. 18. The EN signal goes low when the CLK signal was low just before moment 1805. The output gated clock signal is frozen at its current (low) value, but the input signal D2 to the second latch 1705 begins toggling in rhythm with the input clock signal CLK. Due to the operation of the second latch 1705, the first multiplexer 1702, and the inverter 1701, this causes also the input signal D1 to the first latch 1703 to be frozen at the (low) value it had when the EN signal went low. Now when the EN signal goes high again after moment 1807, the input clock signal CLK is high (i.e. at the opposite value it had when the EN signal went low), and consequently the second multiplexer 1704 is coupling the inverted output of the first latch 1703 to the data input of the second latch 1705. The high value of Q2 causes the inverted input clock signal to constitute, through inverter 1701 and first multiplexer 1702, the input signal D1 to the first latch 1703.

Comparing line Q1 in FIG. 18 after moment 1807 to line CLK2 in FIG. 15 at moment 1512 the important difference is seen. The CLK2 signal passed through by the conventional clock gating circuit of FIG. 14 only begins toggling in synchronism—and in phase—with the CLK1 signal at the next rising edge of the CLK1 signal at moment 1504. The clock gating circuit of FIG. 17 continues the toggling of the gated output clock signal at the very next edge of the input clock signal CLK, which is the falling edge between moments 1807 and 1808. This behavior is typical to the clock gating circuit of FIG. 17: it consistently responds to the enabling signal EN assuming the value that re-enables delivering the toggling gated clock signal GCLK by beginning its continued toggling at the next edge of the input clock signal CLK.

An inevitable consequence of said typical behavior is that the phase of the gated output clock signal may become inverted from what it was, and indeed does so whenever the EN signal goes high during a different phase of the CLK signal than what the CLK signal had when the EN signal went low. This is easy to see in FIG. 18: right after moments 1801 and 1803 the EN signal went low and high respectively while the CLK signal was high at both instances. Consequently the Q1 signal (which constitutes the GCLK signal) continued in phase with the CLK signal after moment 1803. However, between moments 1804 and 1805 the EN signal went low while the CLK signal was low, and right after moment 1807 the EN signal went high while the CLK signal was high. Consequently when the Q1 signal (=GCLK signal) continues toggling after moment 1807, it is phase-inverted in relation to the CLK signal.

Inverting the phase of the gated clock signal does not matter, however, if all flip-flops in the clocked logic circuits, to which the CLK and GCLK signals are delivered, are of the double edge triggered type. For a double edge triggered flip-flop it is only important that there is an edge in the clocking signal, whether it is a rising or a falling edge does not matter.

As a general characterization, a clock gating circuit of the kind described above comprises a phase memory that is configured to memorize the phase of the input clock signal in response to the EN signal going low (i.e. assuming the value that disables delivering the gated clock signal further). The clock gating signal is configured to use the memorized phase as the phase of the gated clock signal in response to the EN signal thereafter going high again. In FIG. 17 the phase memory comprises the first multiplexer 1702 and the inverter 1701 in one of its two input branches. The first multiplexer is configured to be clocked in rhythm with the CLK signal during those periods when the EN signal is low and to stop the clocking of said first multiplexer during those periods when the EN signal is high.

The same principle can be used even if the integrated circuit comprises circuit elements that need a clock pulse window signal for defining the time window during which late-arriving changes in input data should be detected. FIG. 19 illustrates a clock gating circuit that is capable of delivering not only the output gated clock signal GCLK but also an output gated clock pulse window signal GCPW. The clock gating circuit of FIG. 19 comprises a clock pulse window input in the lower left part of the drawing for receiving the input clock pulse window signal CPW, and a gated clock pulse window output for delivering a toggling clock pulse window the desired clocked digital circuits in synchronism with edges in the input clock pulse window signal CPW.

The clock gating circuit of FIG. 19 is configured to freeze the output gated clock pulse window signal GCPW at its current value in response to the EN signal assuming going low, and to respond to the EN signal thereafter going high again by beginning the continued toggling of said output gated clock pulse window signal GCPW at the next edge of the input clock pulse window signal CPW. To this end it comprises another phase memory, consisting of a third multiplexer 1902 and its two input branches, one of which comes through an inverter 1901. The third multiplexer 1902 is clocked with the same signal as the first multiplexer 1702. Its output goes to the data input of a third latch 1903, the output of which provides the output gated clock pulse window signal GCPW. The enabling signal of the third latch 1903 is the same as that of the first latch 1703.

Any integrated circuit could comprise, and benefit from, a clock gating circuit of the kind described above. In particular, advantages are gained in an integrated circuit that comprises one or more double edge triggered flip-flops coupled to receive the output gated clock signal.

Advantageous features of a clock gating signal of the kind described above are recited in concise form in the following numbered clauses.

1. A clock gating circuit for selectively enabling and disabling the delivery of a toggling clock signal to one or more clocked digital circuits, comprising a clock signal input for receiving an input clock signal, a gated clock signal output for delivering said toggling clock signal to said one or more clocked digital circuits in synchronism with edges of said input clock signal, and an enabling input for receiving an enabling signal, two values of which are commands to enable and disable delivering said toggling clock signal respectively, wherein the clock gating circuit is configured to freeze said toggling clock signal at its current value in response to said enabling signal assuming the value that disables delivering said toggling clock signal, and to respond to said enabling signal thereafter assuming the value that enables delivering said toggling clock signal by beginning the continued toggling of said toggling clock signal at the next edge of said input clock signal.

2. A clock gating circuit according to numbered clause 1, comprising a phase memory configured to memorize the phase of said input clock signal in response to said enabling signal assuming the value that disables delivering said toggling clock signal, so that the clock gating circuit is configured to use the memorized phase as the phase of the toggling clock signal in response to said enabling signal thereafter assuming the value that enables delivering said toggling clock signal.

3. A clock gating circuit according to numbered clause 2, wherein said phase memory comprises a first multiplexer with two inputs and an output, so that said input clock signal is coupled to one of said inputs as such and to the other of said inputs inverted.

4. A clock gating circuit according to numbered clause 3, wherein said clock gating circuit is configured to clock said first multiplexer in rhythm with said input clock signal during those periods when said enabling signal has the value that disables delivering said toggling clock signal and to stop the clocking of said first multiplexer during those periods when said enabling signal has the value that enables delivering said toggling clock signal.

5. A clock gating circuit according to any of the numbered clauses 2 to 4, comprising first and second latches, of which the first latch is configured to be enabled by said enabling signal and the second latch is configured to be enabled by an inverse of said enabling signal, and also comprising a second multiplexer configured to be clocked by said input clock signal and to selectively couple, as determined by said clocking input clock signal, either a non-inverted or an inverted output of said first latch to an input of said second latch, wherein an output of said second latch is configured to operate said phase memory.

6. A clock gating circuit according to any of the numbered clauses 1 to 5, comprising a clock pulse window input for receiving an input clock pulse window signal, and a gated clock pulse window signal output for delivering a toggling clock pulse window signal to at least some of said one or more clocked digital circuits in synchronism with edges of said input clock window pulse signal, wherein the clock gating circuit is configured to freeze said toggling clock pulse window signal at its current value in response to said enabling signal assuming the value that disables delivering said toggling clock signal, and to respond to said enabling signal thereafter assuming the value that enables delivering said toggling clock signal by beginning the continued toggling of said toggling clock pulse window signal at the next edge of said input clock pulse window signal.

7. An integrated circuit comprising a clock gating circuit according to any of the numbered clauses 1 to 6.

8. An integrated circuit according to numbered clause 7, comprising one or more double edge triggered flip-flops coupled to receive said toggling clock signal.

9. A set of library instructions for designing a part of an integrated circuit, said set of library instructions being stored on a machine-readable tangible medium and comprising one or more set of one or more machine-readable instructions that, when executed by a computer adapted for designing integrated circuits, are configured to effect the designing of a clock gating circuit according to any of numbered clauses 1 to 6.

A method embodiment of the invention is meant for temporarily storing a digital value obtained from an output of a preceding circuit element and for making such a temporarily stored digital value available for a subsequent circuit element at a controlled moment of time. The method comprises receiving said digital value for temporary storage, and receiving a triggering signal, a triggering edge of which defines an allowable time limit before which a digital value must appear at said data input to become available for said subsequent circuit element. The method comprises also using a sequence of first and second pulse-enabled subregister stages to temporarily store said digital value, and providing said triggering signal to said first pulse-enabled subregister stage delayed with respect to the triggering signal received by said second pulse-enabled subregister stage. The length of the delay is a fraction of a cycle of said triggering signal. Further the method comprises outputting a timing event observation signal as an indicator of said digital value at said data input having changed within a time window that begins at said allowable time limit and is shorter than one cycle of said triggering signal.

Figure 20:
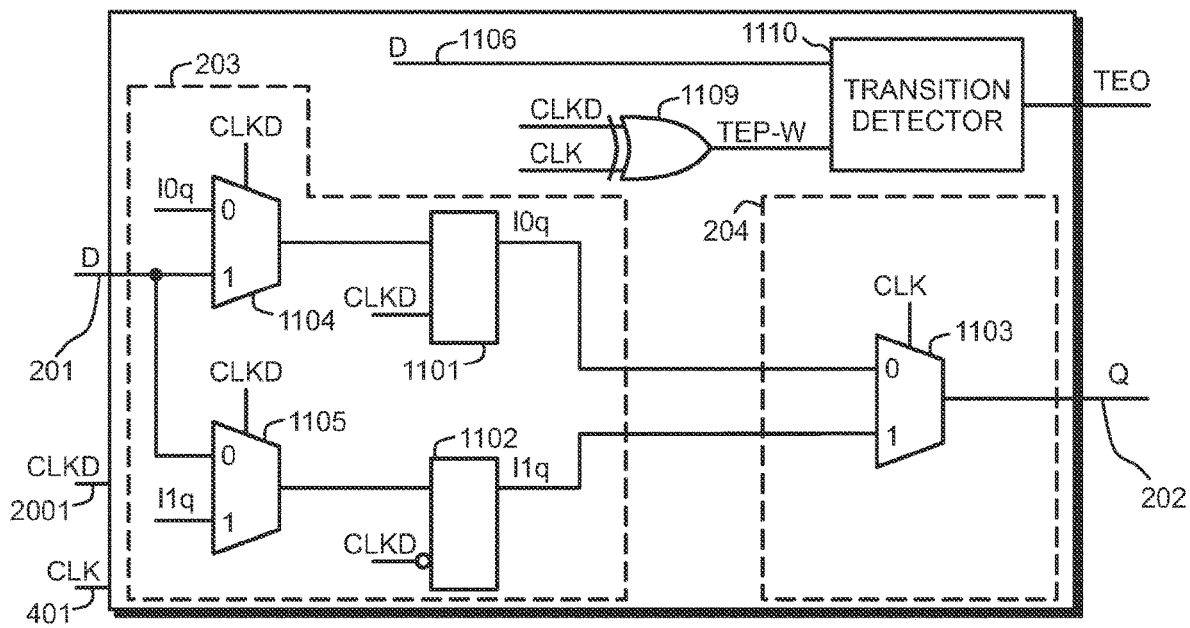
FIG. 20 illustrates a register circuit according to an embodiment.

Changes and modifications are possible to the embodiments described so far without parting from the scope of the appended claims. For example, FIG. 20 illustrates a variation of the register circuit earlier described with reference to FIG. 11. The register circuit of FIG. 20 is a double edge triggered flip-flop, in which the delayed triggering signal CLKD is not produced within the register circuit itself but received from outside through a dedicated input 2001.

Another class of variations is related to the number of stages inside the register circuit. For example, even if the register circuit has been consistently shown to comprise exactly two stages (the first and second pulse-enabled subregister stages), saying that the register circuit comprises a sequence of these stages does not exclude it from having additionally third, fourth, etc. subregister stages along the data path between the data input and the data output. Also, while the register circuits have been described as storing one-bit digital values, a register circuit according to the invention may temporarily store multi-bit digital values. This can be achieved for example by having parallel data paths between the data input and the data output, each data paths being configured to temporarily store one bit of the multibit value.

Another class of variations is related to the use of a margin adder circuit for making the time window longer at its beginning, at its end, or at both its beginning and its end. The margin adder circuit may be coupled to the timing event observation logic and configured to displace in time at least one edge of the time window with reference to a corresponding edge of the triggering signal.

Figure 21:
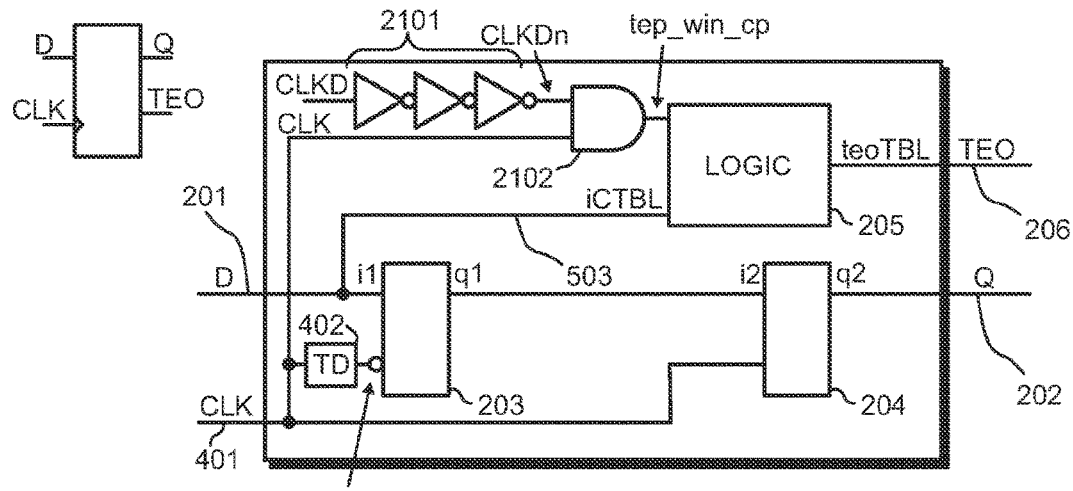
FIG. 21 illustrates a register circuit according to an embodiment.

An example of such a variation is shown schematically in FIG. 21. The register circuit shown in FIG. 21 has certain resemblance to that shown in FIG. 5 earlier, and similar parts are shown with the same reference designators. The margin adder circuit comprises an inverting delay line 2101 and an AND gate 2102. The input of the inverting delay line 2101 is coupled to receive the delayed clock signal CLKD and configured to output a signal CLKDn, which is a further delayed and inverted version of the delayed clock signal CLKD. This signal and the clock signal CLK constitute the inputs to the AND gate 2102, the output of which is called the tep_win_cp signal, a high logical value of which corresponds to the time window for detecting timing events.

Figure 22:
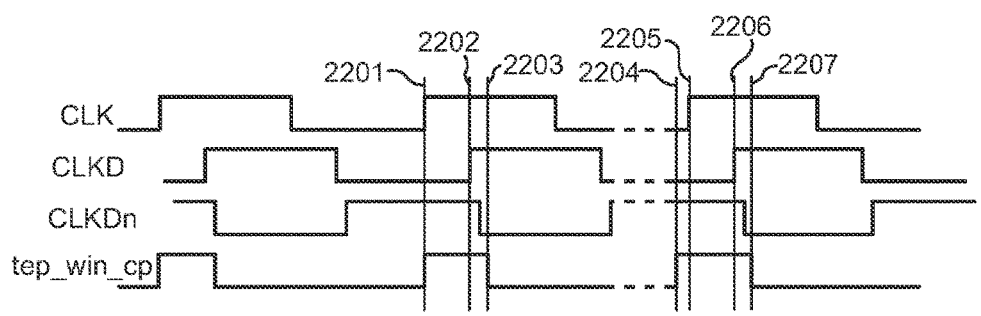
FIG. 22 is a timing diagram of certain signals in a register circuit according to FIG. 21.

FIG. 22 shows an example of the CLK, CLKD, CLKDn, and tep_win_cp signals. Without using the margin adder circuit the edges of the time window for detecting timing events would be defined by the rising edge of the CLK signal and the next rising edge of the CLKD signal, like at moments 2201 and 2202. The margin adder circuit of FIG. 21 has the effect of displacing (delaying) the right-hand edge of the time window until moment 2203. The small delay between the falling edge of the CLKDn signal and the subsequent falling edge of the tep_win_cp signal is due to the signal propagation delay in the AND gate 2102.

Some additional circuitry could be used in the margin adder circuit to displace (to advance) also the left-hand edge of the time window, so that it would occur slightly before the rising edge in the CLK signal. An example of displacing both edges of the time window, for making the time window longer than without said displacing, is shown on the right in FIG. 22: the beginning of the time window is advanced from 2205 to 2204, and the end of the time window is delayed from 2206 to 2207. The fact that some additional circuitry (compared to that of FIG. 21) would be used, in particular for advancing the beginning of the time window, is emphasized by separating the parts of FIG. 22 with dashed lines. Such additional circuitry could involve e.g. a sufficiently long delay that would actually produce the subsequent rising edge in the tep_win_cp signal from a previous rising edge of the CLK signal.

The use of a margin adder circuit involves the advantage of compensating for arbitrary jitter in the timing of operation in individual circuit elements. If the timing window is defined strictly by the edges of a CLK (and CLKD) signal, it may happen that a timing event that actually occurred within the time window and should have been dealt with accordingly does not cause a timing event observation signal because the timing event observation logic actually operated according to a time window that was shorter than meant. The extra margin added by a margin adder circuit helps to ensure that a timing event observation signal is always generated when needed.

Handling multibit values may involve also time interleaving; in a way, a double edge triggered flip-flop may be considered as a register circuit for temporarily storing two-bit digital values, so that the first bit is temporarily stored and made available on the rising edge of the clock signal and the second bit is temporarily stored and made available on the falling edge of the clock signal.

Two or more register circuits for temporarily storing single-bit digital values can share some logic parts. For example, two or more register circuits of this kind may have common parts related to the detection of late-arriving changes, like common transition detectors.

In an integrated circuit that comprises a number of register circuits of the kind described above the TEO signals should be collected from all said register circuits and handled in an intelligent way. It may be sufficient just to know, for a plurality of register circuits, that a timing event was observed in one of them, without knowing exactly which one. A higher-level logic that is responsible for correct operation of one or more pipelines may take certain actions, which are known as such. For example, a certain delay may be introduced in the common clock signal so that circuit elements downstream from the one in which the timing event occurred have sufficient time to recover and ensure that they received the valid data.

The invention claimed is:

1. A register circuit for temporarily storing a digital value obtained from an output of a preceding circuit element, the register circuit comprising:
   a data input for receiving said digital value for temporary storage,
   a data output for outputting the temporarily stored digital value,
   a triggering event input for receiving a triggering signal, a triggering edge of which defines an allowable time limit before which a digital value must appear at said data input to become temporarily stored, and
   on the data propagation path between said data input and data output a sequence of a first pulse-enabled subregister stage and second pulse-enabled subregister stage;
   wherein said first pulse-enabled subregister stage is configured to receive said triggering signal delayed with respect to the triggering signal received by said second pulse-enabled subregister stage, the length of the delay being a fraction of a cycle of said triggering signal,
   wherein said register circuit comprises a timing event observation logic configured to output a timing event observation signal at an output of said register circuit as an indicator of said digital value at said data input having changed within a time window that begins at said allowable time limit and is shorter than one cycle of said triggering signal,
   wherein the register circuit is a dual edge triggered flip-flop, and
   wherein said timing event observation logic comprises:
   a TE data input coupled to said data input of the register circuit,
   a TE clock input coupled to said triggering event input of the register circuit, a TE delay element coupled to said TE clock input and configured to delay the triggering signal received at said TE clock input by the length of said delay, an XOR gate coupled to said TE clock input and said TE delay element and configured to produce an active timing window indicator signal whenever the values received from said TE clock input and said TE delay element are unequal, and a transition detector coupled to said TE data input and the output of said XOR gate and configured to produce said timing event observation signal in response to the value in said TE data input changing while said timing window indicator signal is active.

2. A register circuit according to claim 1, comprising a delay element between said clock input and said first pulse-enabled subregister stage for delaying the received triggering signal on its way to an enabling input of said first pulse-enabled subregister stage.

3. A register circuit according to claim 1, comprising a delayed clock input for receiving a separate delayed version of said triggering signal, and a coupling from said delayed clock input to said first pulse-enabled subregister stage.

4. A register circuit according to claim 1, wherein:
said first pulse-enabled subregister stage comprises two parallel branches of said data propagation path, each of said parallel branches comprising a latch, so that the latches on the first and second parallel branches are clocked at opposite phases of said delayed triggering signal, and said second pulse-enabled subregister stage comprises a multiplexer configured to alternatingly couple outputs of said latches on the first and second parallel branches to said data output at opposite values of said triggering signal.

5. An integrated circuit, comprising at least one register circuit for temporarily storing a digital value obtained from an output of a circuit element preceding the at least one register circuit in the integrated circuit, the at least one register circuit comprising:

a data input for receiving said digital value for temporary storage, a data output for outputting the temporarily stored digital value, a triggering event input for receiving a triggering signal, a triggering edge of which defines an allowable time limit before which a digital value must appear at said data input to become temporarily stored, and on the data propagation path between said data input and data output a sequence of a first pulse-enabled subregister stage and second pulse-enabled subregister stage;

wherein said first pulse-enabled subregister stage is configured to receive said triggering signal delayed with respect to the triggering signal received by said second pulse-enabled subregister stage, the length of the delay being a fraction of a cycle of said triggering signal, wherein said register circuit comprises a timing event observation logic configured to output a timing event observation signal at an output of said register circuit as an indicator of said digital value at said data input having changed within a time window that begins at said allowable time limit and is shorter than one cycle of said triggering signal, wherein the register circuit is a dual edge triggered flip-flop, and wherein said timing event observation logic comprises:
a TE data input coupled to said data input of the register circuit, a TE clock input coupled to said triggering event input of the register circuit, a TE delay element coupled to said TE clock input and configured to delay the triggering signal received at said TE clock input by the length of said delay, an XOR gate coupled to said TE clock input and said TE delay element and configured to produce an active timing window indicator signal whenever the values received from said TE clock input and said TE delay element are unequal, and a transition detector coupled to said TE data input and the output of said XOR gate and configured to produce said timing event observation signal in response to the value in said TE data input changing while said timing window indicator signal is active.

6. An integrated circuit according to claim 5, comprising a multitude of data processing paths, wherein said at least one register circuit is located along such a data processing path the time criticality of which is higher than that of another data processing path within said integrated circuit.

7. A set of library instructions for designing an integrated circuit, said set of library instructions being stored on a machine-readable tangible medium and comprising one or more set of one or more machine-readable instructions that, when executed by a computer adapted for designing integrated circuits, are configured to effect the designing of a register circuit for temporarily storing a digital value obtained from an output of a preceding circuit element, the register circuit comprising:

a data input for receiving said digital value for temporary storage, a data output for outputting the temporarily stored digital value, a triggering event input for receiving a triggering signal, a triggering edge of which defines an allowable time limit before which a digital value must appear at said data input to become temporarily stored, and on the data propagation path between said data input and data output a sequence of a first pulse-enabled subregister stage and second pulse-enabled subregister stage;

wherein said first pulse-enabled subregister stage is configured to receive said triggering signal delayed with respect to the triggering signal received by said second pulse-enabled subregister stage, the length of the delay being a fraction of a cycle of said triggering signal, wherein said register circuit comprises a timing event observation logic configured to output a timing event observation signal at an output of said register circuit as an indicator of said digital value at said data input having changed within a time window that begins at said allowable time limit and is shorter than one cycle of said triggering signal, wherein the register circuit is a dual edge triggered flip-flop, and wherein said timing event observation logic comprises:
a TE data input coupled to said data input of the register circuit, a TE clock input coupled to said triggering event input of the register circuit, a TE delay element coupled to said TE clock input and configured to delay the triggering signal received at said TE clock input by the length of said delay, an XOR gate coupled to said TE clock input and said TE delay element and configured to produce an active timing window indicator signal whenever the values received from said TE clock input and said TE delay element are unequal, and a transition detector coupled to said TE data input and the output of said XOR gate and configured to produce said timing event observation signal in response to the value in said TE data input changing while said timing window indicator signal is active.

8. A method for temporarily storing a digital value obtained from an output of a preceding circuit element and for making such a temporarily stored digital value available for a subsequent circuit element at a controlled moment of time, the method comprising:

receiving said digital value for temporary storage, and receiving a triggering signal, a triggering edge of which defines an allowable time limit before which a digital value must appear at a data input to become available for said subsequent circuit element, using a sequence of first and second pulse-enabled subregister stages to temporarily store said digital value, and providing said triggering signal to said first pulse-enabled subregister stage delayed with respect to the triggering signal received by said second pulse-enabled subregister stage, the length of the delay being a fraction of a cycle of said triggering signal, wherein said sequence of first and second pulse-enabled subregister stages constitutes a dual edge triggered flip-flop, outputting a timing event observation signal as an indicator of said digital value at said data input having changed within a time window that begins at said allowable time limit and is shorter than one cycle of said triggering signal, and wherein said timing event observation logic comprises:

a TE data input coupled to said data input of the register circuit, a TE clock input coupled to a clock input of the register circuit, a TE delay element coupled to said TE clock input and configured to delay the triggering signal received at said TE clock input by the length of said delay, an XOR gate coupled to said TE clock input and said TE delay element and configured to produce an active timing window indicator signal whenever the values received from said TE clock input and said TE delay element are unequal, and a transition detector coupled to said TE data input and the output of said XOR gate and configured to produce said timing event observation signal in response to the value in said TE data input changing while said timing window indicator signal is active.

* * * * *